United States Patent [19]
Krause

[11] Patent Number: 5,883,395
[45] Date of Patent: Mar. 16, 1999

[54] MONOLITHIC, MULTIPLE-CHANNEL OPTICAL COUPLER

[75] Inventor: Robert Krause, Menlo Park, Calif.

[73] Assignee: Siemens Microelectronics, Inc., Cupertino, Calif.

[21] Appl. No.: 933,795

[22] Filed: Sep. 19, 1997

Related U.S. Application Data

[63] Continuation of Ser. No. 597,339, Feb. 6, 1996, abandoned, which is a continuation of Ser. No. 125,945, Sep. 23, 1993, abandoned.

[51] Int. Cl.⁶ .................................................. G02B 27/00
[52] U.S. Cl. .............................. 250/551; 257/84; 327/514
[58] Field of Search .................................. 250/551, 552, 250/553; 257/431, 434, 80–84; 327/514

[56] References Cited

U.S. PATENT DOCUMENTS

| | | | |
|---|---|---|---|
| 3,413,480 | 11/1968 | Biard et al. | 250/211 |
| 4,695,120 | 9/1987 | Holder | 350/96.11 |
| 4,847,507 | 7/1989 | Matson et al. | 250/551 |
| 4,989,935 | 2/1991 | Stein | 257/84 |
| 5,089,948 | 2/1992 | Brown et al. | 363/58 |
| 5,093,879 | 3/1992 | Bregman et al. | 385/93 |
| 5,245,198 | 9/1993 | Kusuda et al. | 250/551 |
| 5,287,376 | 2/1994 | Paoli | 372/43 |
| 5,332,894 | 7/1994 | Fujimoto | 250/208.2 |
| 5,340,993 | 8/1994 | Salina et al. | 250/551 |
| 5,355,386 | 10/1994 | Rothman et al. | 257/84 |
| 5,424,573 | 6/1995 | Kato et al. | 257/431 |

FOREIGN PATENT DOCUMENTS

| | | |
|---|---|---|
| 0084621 | 8/1983 | European Pat. Off. . |
| 0416284 | 3/1991 | European Pat. Off. . |
| 0463390 | 1/1992 | European Pat. Off. . |
| 4133773 | 4/1992 | Germany . |

*Primary Examiner*—Stephone Allen

[57] ABSTRACT

By using a monolithic sheet of photodetector semiconductor and creating a series of isolated individual optical paths, the performance of a multiple channel coupler can be improved. Multiple photodetectors are fabricated on the substrate, yielding electro-optically matched devices. By using common connection of the photodetectors and common connection of the optical sources, the pin-per-channel count is minimized.

21 Claims, 3 Drawing Sheets

MONOLITHIC, MULTIPLE-CHANNEL OPTICAL COUPLER

CROSS-REFERENCE TO RELATED APPLICATION

This is a continuation of Ser. No. 08/597,339 filed Feb. 6, 1996, now abandoned, which is a continuation of Ser. No. 08/125,945 filed Sep. 24, 1993, now abandoned.

FIELD OF THE INVENTION

This invention generally relates to optical couplers. Specifically, the invention is directed to a monolithic multiple channel optical coupler.

BACKGROUND OF THE INVENTION

Existing optical couplers generally exhibit a variation in performance from device to device. For example, the current transfer ratio and speed of an optical device can vary significantly. This can pose a significant problem when one is coupling multiple channels and minimal device-to-device variation is needed to preserve relative channel signal levels.

Part of the problem can be minimized by using multiple channel couplers. However, since the individual optical devices within such couplers may be fabricated from different wafers or different portions of the same wafer, they are not necessarily matched devices. Further, such couplers may not use isolated optical paths for the devices to minimize cross-talk. Thus, even within one package, performance variations persist.

It would be helpful therefore to provide a coupler that can handle multiple signals with minimal channel-to-channel variation in signal transfer performance. Also, it is desirable to provide a coupler that has the maximum number of isolated channels using the least number of pins, to reduce assembly costs and to reduce the required printed circuit board space.

SUMMARY OF THE INVENTION

These and other objects are achieved by a monolithic-detector, multiple-channel optical coupler having common LED-emitter cathodes and common photodetector collectors, or having common LED-emitter anodes and common photodetector emitters. The photodetectors are contained on a single, monolithic semiconductor substrate which provides electro-optically matched devices and common connections for the devices. Although the individual coupling devices share electrical commonality, they are optically isolated by the use of a light pipe arrangement between the LED-emitters and the photodetectors. Moreover, pin count is minimized by using common connections for the LED-emitters and the photodetectors.

BRIEF DESCRIPTION OF THE DRAWINGS

A more complete understanding of the present invention, as well as other objects and advantages thereof not enumerated herein, will become apparent upon consideration of the following detailed description and the accompanying drawings, wherein.

DETAILED DESCRIPTION

The emitters and photodetectors described here are of the kind discussed in the Siemens Optoelectronics Data Book 1993. It should be understood that other devices can be used as well. Also, the coupler could be used with other types of electromagnetic radiation, such as ultraviolet light.

Figure 1:
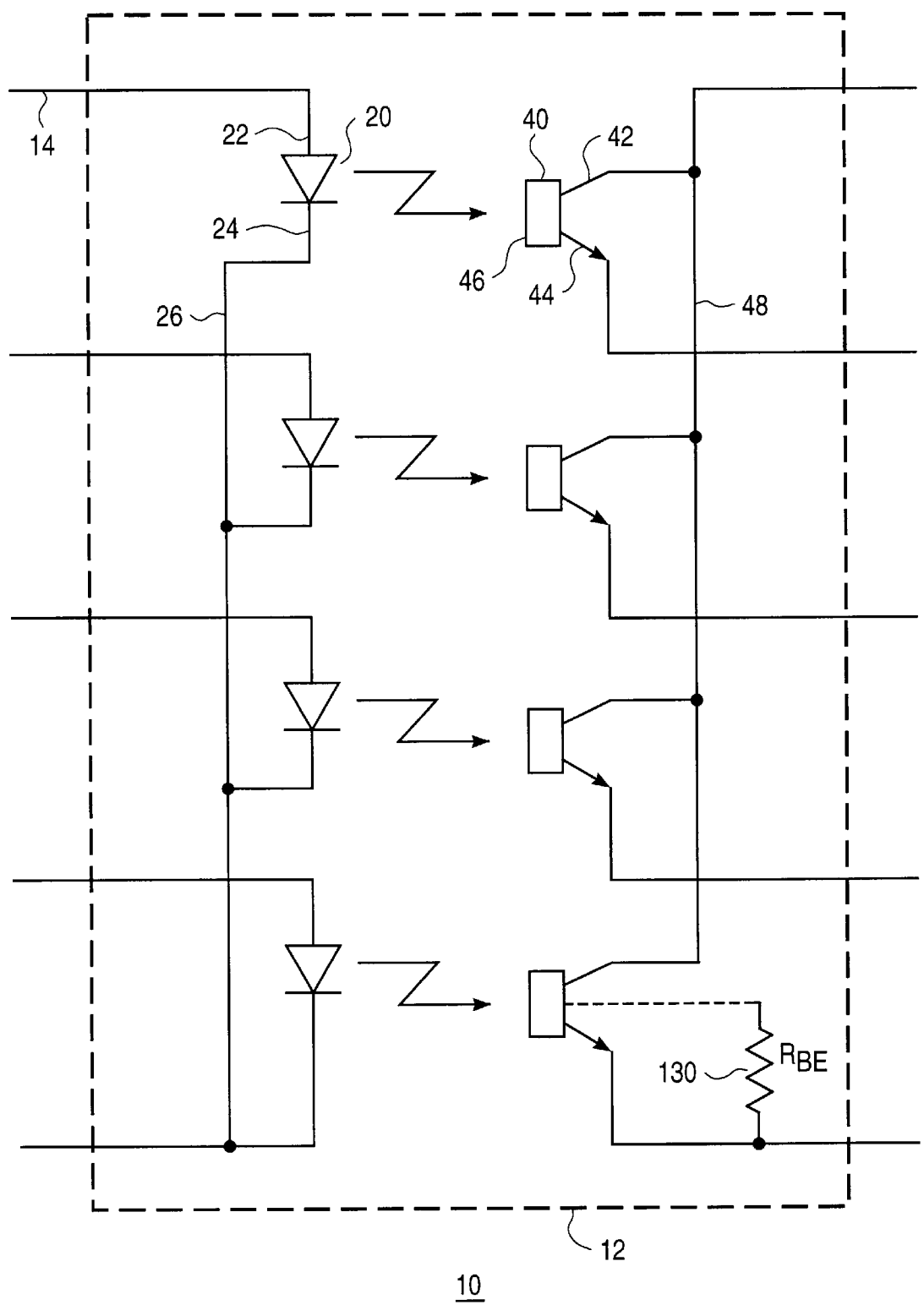
FIG. 1 is an electrical schematic diagram of a monolithic-detector, multiple-channel optical coupler constructed in accordance with the present invention.

A monolithic-detector, multiple-channel optical coupler 10 is shown in the electrical schematic diagram of FIG. 1. The coupler 10 shown here is contained in a dual in-line package 12 having ten pins 14, but could be held in any other suitable packaging device. The coupler 10 has four gallium arsenide LED (light emitting diode) emitters 20 (or some other suitable emitter), each having an anode 22 and a cathode 24 with the cathodes 24 tied to a first common bus 26, and four photodetectors 40, each having a collector 42, an emitter 44, and a base 46, with the collectors 42 tied to a second common bus 48. Each LED-emitter 20/photodetector 40 pair is used to couple one signal channel for the coupler 10.

Figure 6:
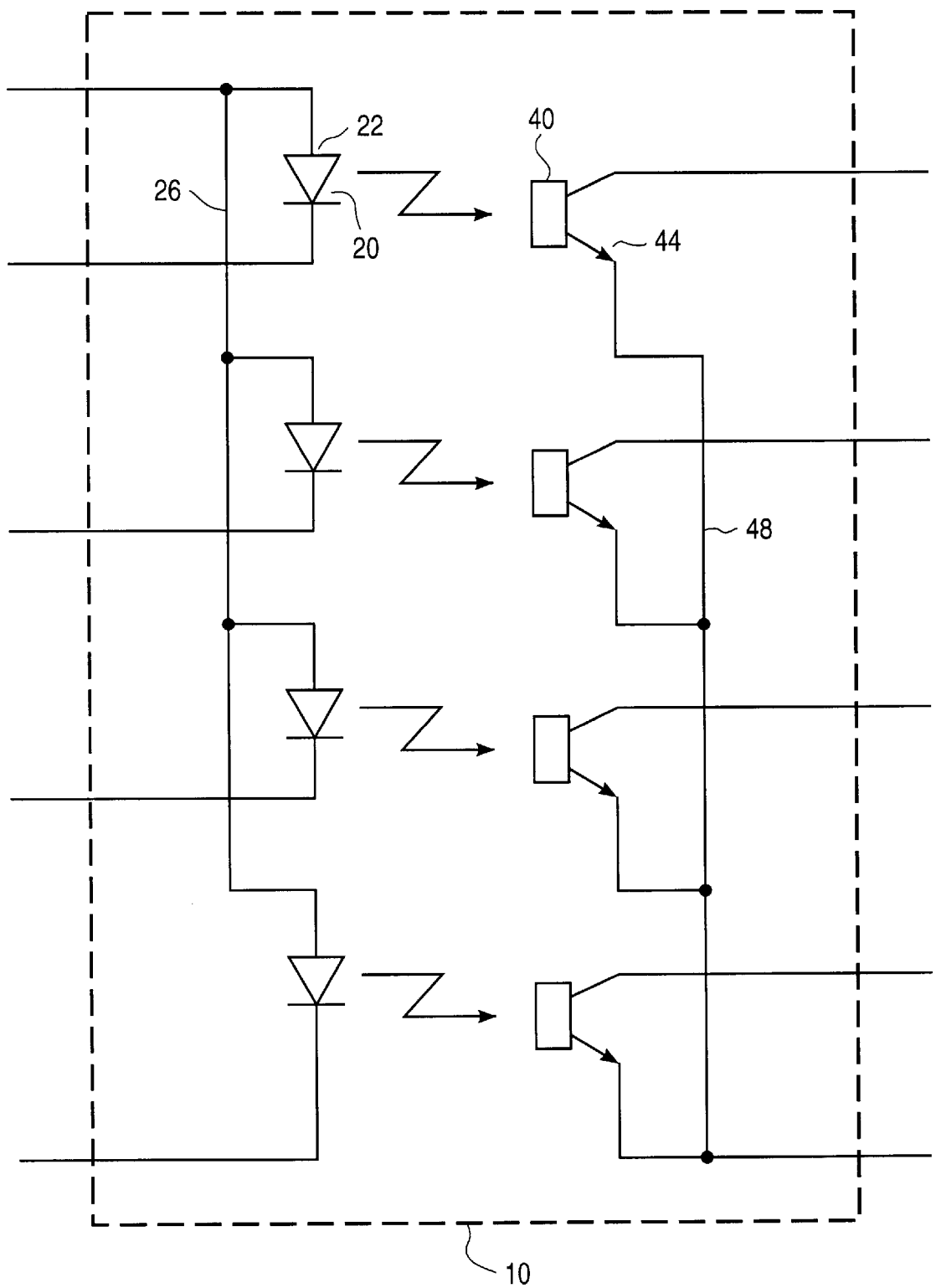
FIG. 6 is an alternative electrical schematic diagram of a monolithic-detector.

The number four is arbitrary; any number of devices could be provided. Also, one could commonly connect the anodes 22 of the LED emitters 20 instead of the cathodes 24 and similarly connect the emitters 44 instead of the collectors 42 of the photodetectors 40, as shown in FIG. 6. Moreover, one could use photodiodes instead of the depicted phototransistors for the photodetectors 40. Finally, if the application required it, one could choose to bring out from the package 12 individual leads for every device, i.e., every LED emitter and photodetector.

As shown, the anodes 22 of the LED emitters 20 and the emitters 44 of the photodetectors 40 are each connected to individual pins 14. The common buses 26 and 48 for the cathodes 24 and the collectors 42, respectively, are also connected to separate pins 14 of the package 12. Alternatively, individual cathode 24 and/or collector 42 connections could be provided.

Figure 2:
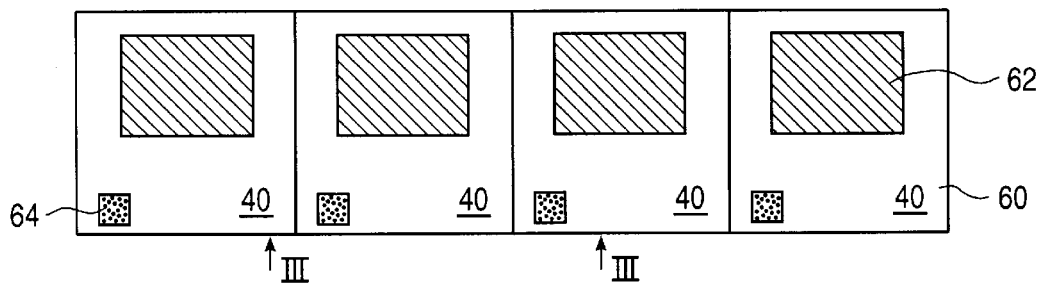
FIG. 2 is a top-view of a substrate containing photodetectors of the coupler of FIG. 1.

The physical structure of the coupler 10 is illustrated in FIGS. 2 through 5. In FIG. 2, a monolithic semiconductor substrate 60 having four photodetectors 40 is shown. A photodetector region 62 for each photodetector 40 and connecting pads 64 for each associated emitter 44 is visible in this view. Because the four devices come from adjacent portions of the same wafer and their characteristics are thus nearly the same, this arrangement offers nearest neighbor matching of performance or operating characteristics.

Figure 3:
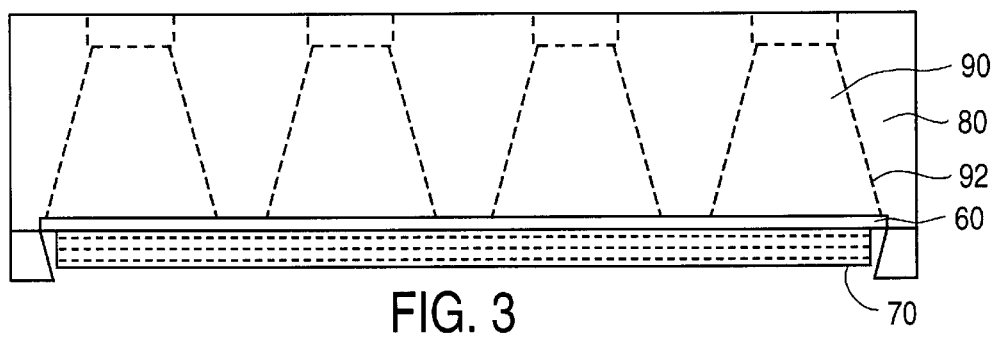
FIG. 3 is a front-elevation partial assembly view of the coupler of FIG. 1.

A front-elevation partial assembly view of the coupler 10 is shown in FIG. 3. The substrate 60 is located on a mounting base 70. An opaque shield 80 fabricated from an opaque material, for example, white Lexan®, is positioned over the substrate 60. White is preferable because it reflects light. Within the shield 80 are formed respective light pipes 90 for the passage of light to the photodetector regions 62. The light pipes 90 have an inward taper 92 from the substrate 60 upwards to minimize cross talk between the channels formed thereby.

Figure 4:
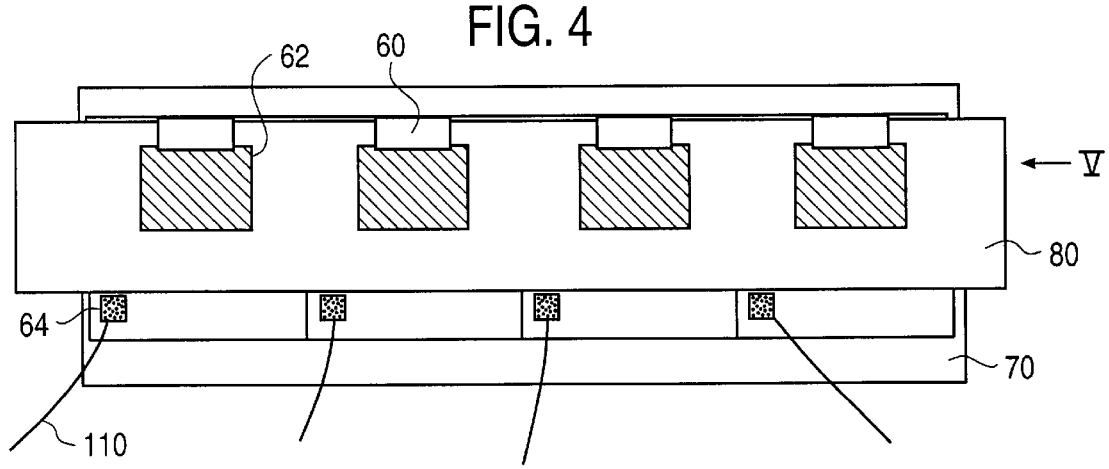
FIG. 4 is a top partial-assembly view of the coupler of FIG. 1.

A top partial-assembly view of the coupler 10 is shown in FIG. 4. In addition to the elements illustrated in FIGS. 2 and 3, there are electrically-conductive wires 110 connected to the pads 64 for the emitters 44 of the photodetectors 40. As indicated above, the wires 110 are each connected to individual pins 14 of the coupler package 12.

Figure 5:
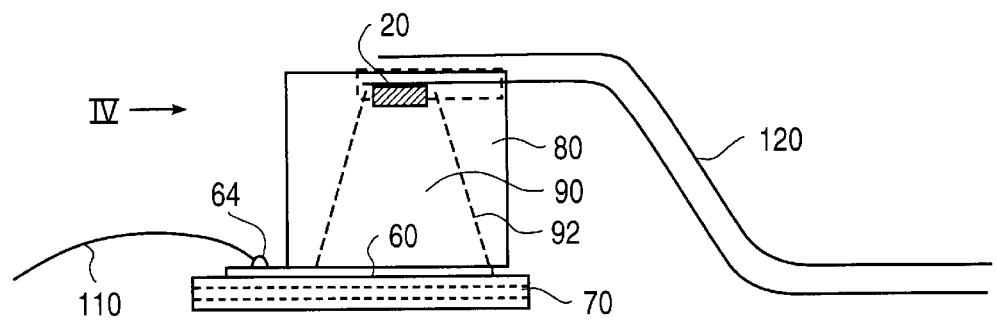
FIG. 5 is a side elevation assembly view of the coupler of FIG. 1.

In FIG. 5, a side elevation assembly view of the coupler 10, an electrically-conductive wire 120 is shown connected to the anode 22 of an LED emitter 20. Similar wires 120 are connected to the anodes 22 of the other LED emitters 20. As indicated above, the wires 120 are each connected to individual pins 14 of the coupler package 12. Note that the LED emitter 20 is positioned at the tapered end of the light pipe 90 and opposite the respective photodetector region 62. The other LED emitters 20 are similarly positioned at the other light pipes 90 so that each LED emitter 20 is paired with a respective photodetector region 62 via an individual light pipe 90.

In actual manufacture of the coupler 10, one could choose to use a detector strip or sheet die attached in one operation on a common lead frame pad or with individual lead frame connections. Also, the individual photodetector region 62/emitter 44 pairs need not be arranged in a line but could be configured in a square or any other desired arrangement that provides electro-optically matched photodetectors 60.

In operation, the optical coupler 10 is used to transmit signal information between respective circuitry while maintaining electrical isolation therebetween. This is accomplished since optical signals, and not electrical signals, are passed between the LED-emitters 20 and the photodetectors 40 which are connected to respective portions of the circuitry. The common collector arrangement of the photodetectors 40 results in a non-inverting amplification of the optical signal received from the LED-emitters 20. Thus, when a particular LED emitter 20 has been turned "on" (i.e., is conducting) by the respective driving circuitry, the light emitted to the respective photodetector 40 will cause the output of the photodetector 40 to be at a high voltage level. The output of the photodetector 40 is connected to the remainder of the circuitry. Similarly, when a particular LED emitter 20 is turned "off" (i.e., is not conducting), no light will be emitted to the respective photodetector 40 and the output of the photodetector 40 will be at a low voltage level. The light pipes 90 ensure that the light pathway between a respective LED emitter 20 and photodetector 40 is isolated from the other light pathways. As a result, no mixing of optical signals occurs (i.e., no cross talk occurs) and each photodetector 40 receives only one optical signal. Note that, in data communications applications, all signals can be referenced to a common ground on either side of the isolation barrier.

To improve the speed performance characteristics of the coupler 10, it is helpful to provide a resistance $R_{BE}$ 130 between the base 46 and the emitter 44 in each photodetector 40, as shown for one photodetector 40 in FIG. 1.

The coupler 10 achieves an improved channel density per pin count by the use of the common connections of the LED emitters 20 and the photodetectors 40 in lieu of bringing out separate leads for each device. The number of pins required for the common connections is two plus twice the number of channels to be coupled. Thus, for a four-channel coupler 10, the number of required pins equals ten. This is in contrast to presently available four-channel couplers that require sixteen pins and, thus, a much larger package. Advantageously, the coupler 10 achieves this improvement in pin count and packaging while increasing performance.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A semiconductor component, comprising:
   (a) a plurality of means for generating an optical signal;
   (b) means for optically isolating each optical signal; and
   (c) a plurality of means for detecting optical signals, where the plurality of means for detecting are fabricated on a monolithic semiconductor substrate,
   wherein each of said means for detecting is electro-optically matched in performance with every other means for detecting.

2. The apparatus as set forth in claim 1, wherein the means for optically isolating is an opaque shield having a plurality of apertures, each aperture accommodating only one optical signal.

3. The apparatus as set forth in claim 2, wherein the apertures are tapered.

4. The apparatus as set forth in claim 1, wherein the means for generating are operably connected in common.

5. The apparatus as set forth in claim 1, wherein the means for generating is an LED having an anode and a cathode and the cathodes of each LED are connected in common.

6. The apparatus as set forth in claim 1, wherein the means for generating is an LED having an anode and a cathode and the anodes of each LED are connected in common.

7. An apparatus as in claim 1, wherein the plurality of means for generating an optical signal, the means for optically isolating each signal, and the plurality of means for detecting are packaged within a dual in-line package.

8. The apparatus as set forth in claim 1, wherein the means for detecting are operably connected in common.

9. The apparatus as set forth in claim 1, wherein the means for detecting is a photodetector having a collector, a base, and an emitter, and the collectors of the photodetectors are connected in common.

10. The apparatus as set forth in claim 9, wherein the collectors are connected through the substrate.

11. The apparatus as set forth in claim 9, wherein each photodetector has a resistor connected between the base and the emitter.

12. The apparatus as set forth in claim 1, wherein the means for detecting is a photodetector having a collector, a base, and an emitter, and the emitters of the photodetectors are connected in common.

13. The apparatus as set forth in claim 12, wherein the emitters are connected through the substrate.

14. The apparatus as set forth in claim 1, wherein the means for optically isolating is a plurality of light pipes, each light pipe carrying an optical signal between respective means for generating and means for detecting.

15. A multiple channel, optical coupler, comprising:
   (a) a monolithic semiconductor substrate;
   (b) a plurality of photodetectors formed on the substrate;
   (c) a plurality of light emitters formed on the substrate; and
   (d) a plurality of light pipes that transmit light from the light emitters to the photodetectors, each light pipe establishing a light pathway between one photodetector and one light emitter,
   wherein each of said means for detecting is electro-optically matched in performance with every other means for detecting.

16. The coupler as set forth in claim 15, wherein the photodetectors are connected in common.

17. The coupler as set forth in claim 15, wherein the light emitters are connected in common.

18. The coupler as set forth in claim 15, wherein the plurality of light pipes is formed by an opaque shield having a plurality of passages formed therethrough, each passage establishing a light pathway between one photodetector and one light emitter.

19. The coupler as set forth in claim 18, wherein the passages are tapered.

20. The coupler as set forth in claim 15, wherein the photodetectors are formed on the substrate so as to obtain electro-optically matching operating characteristics.

21. The coupler as set forth in claim 15, further including a plurality of input and output terminals, where the total number of terminals is equal to two plus twice the number of channels.

* * * * *